United States Patent
Keating et al.

(10) Patent No.: US 6,667,232 B2
(45) Date of Patent: *Dec. 23, 2003

(54) THIN DIELECTRIC LAYERS AND NON-THERMAL FORMATION THEREOF

(75) Inventors: Steven J. Keating, Beaverton, OR (US); Robert S. Chau, Aloha, OR (US); Reza Arghavani, Aloha, OR (US); Jack T. Kavalieros, Portland, OR (US); Douglas W. Barlage, Beaverton, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 5 days.

(21) Appl. No.: 09/208,268

(22) Filed: Dec. 8, 1998

(65) Prior Publication Data

US 2002/0003258 A1 Jan. 10, 2002

(51) Int. Cl.[7] ............ H01L 21/4763; H01L 21/31; H01L 31/119; H01L 29/76; H01L 23/58
(52) U.S. Cl. ............ 438/632; 438/637; 438/762; 438/769; 438/770; 438/954; 257/313; 257/411; 257/639
(58) Field of Search ............ 438/637, 769, 438/762, 954, 720, 632; 257/313, 411, 639

(56) References Cited

U.S. PATENT DOCUMENTS

| | | | | | |
|---|---|---|---|---|---|
| 4,621,277 | A | * | 11/1986 | Ito et al. | 357/54 |
| 4,842,888 | A | * | 6/1989 | Haluska et al. | 427/38 |
| 4,851,370 | A | * | 7/1989 | Doklan et al. | 437/225 |
| 5,674,788 | A | * | 10/1997 | Wristers et al. | 437/239 |
| 5,679,169 | A | * | 10/1997 | Gonzales et al. | 134/1.3 |
| 5,821,172 | A | * | 10/1998 | Gilmer et al. | 438/769 |
| 5,840,610 | A | * | 11/1998 | Gilmer et al. | 438/301 |
| 5,851,888 | A | * | 12/1998 | Gardner et al. | 438/301 |
| 5,939,333 | A | * | 8/1999 | Hurley et al. | 437/241 |
| 5,940,736 | A | * | 8/1999 | Brady et al. | 438/787 |
| 5,972,611 | A | * | 10/1999 | Furuichi et al. | 435/6 |

OTHER PUBLICATIONS

Silicon Ptocessing for The VLSI era, Stanley Wolf and R.N. Tauber, 1986.*

* cited by examiner

Primary Examiner—Long Pham
Assistant Examiner—Shrinivas H. Rao
(74) Attorney, Agent, or Firm—Blakely, Sokoloff, Taylor & Zafman LLP

(57) ABSTRACT

A method of forming a dielectric layer suitable for use as the gate dielectric layer in a MOSFET includes passivating the surface of a semiconductor substrate at a temperature less than approximately 80° C. and nitridizing the passivation layer. In particular embodiments, passivating a silicon wafer includes forming a hydroxy-silicate layer at approximately 24° C. In a further aspect of the present invention, an integrated circuit includes a plurality of insulated gate field effect transistors, wherein various ones of the plurality of transistors have gate dielectric layers of the nitridized passivation layer.

17 Claims, 2 Drawing Sheets

THIN DIELECTRIC LAYERS AND NON-THERMAL FORMATION THEREOF

BACKGROUND OF THE INVENTION

1. Field of the Invention

The present invention relates generally to semiconductor structures and manufacturing. More particularly, the invention relates to extremely thin dielectric layers and the formation thereof.

2. Background

Advances in semiconductor manufacturing technology have led to the integration of millions of circuit elements, such as transistors, on a single integrated circuit (IC). In order to integrate increasing numbers of circuit elements onto an integrated circuit it has been necessary to reduce the line widths of the various parts that make up an integrated circuit. Not only have interconnect line widths become smaller, but so have the dimensions of metal-oxide-semiconductor field effect transistors (MOSFETs).

MOSFETs are also sometimes referred to as insulated gate field effect transistors (IGFETs). Most commonly, these devices are referred to simply as FETs, and are so referred to in this disclosure.

Transistor scaling typically involves more than just the linear reduction of the FET width and length. For example, both source/drain (S/D) junction depth and gate dielectric thickness are also typically reduced in order to produce a FET with the desired electrical characteristics.

Over the years, a substantial amount of research and development in the field semiconductor manufacturing has been dedicated to providing reduced thickness dielectric layers, as mentioned above. However, to be suitable for use as a MOSFET gate dielectric layer, these reduced thickness dielectric layers are typically required to have certain characteristics. For example, the dielectric layer should have a low density of interface states, a low density of defects, and a dielectric breakdown voltage high enough for use with the desired voltages that the MOSFET will encounter during operation.

What is needed is an extremely thin dielectric layer suitable for use as the gate dielectric layer in a MOSFET, and what is further needed are methods of making such a dielectric layer.

SUMMARY OF THE INVENTION

Briefly, a method of forming a dielectric layer suitable for use as the gate dielectric layer in a MOSFET includes passivating the surface of a semiconductor substrate at a temperature less than approximately 80° C. and nitridizing the passivation layer.

In a further aspect of the present invention, an integrated circuit includes a plurality of insulated gate field effect transistors, wherein various ones of the plurality of transistors have gate dielectric layers of a nitridized passivation layer.

DETAILED DESCRIPTION

Terminology

Figure 1:
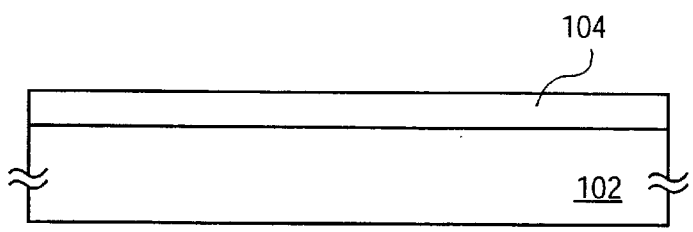
FIG. 1 is a schematic cross-sectional view of a wafer with a first oxide layer formed on the surface thereof.

The terms, chip, integrated circuit, monolithic device, semiconductor device, and microelectronic device, are often used interchangeably in this field. The present invention is applicable to all the above as they are generally understood in the field.

Historically, the material most commonly used in the semiconductor industry to form the gate insulator layer of a FET is silicon dioxide. Thus, the gate insulator layer is frequently referred to simply as the gate oxide. The expression gate dielectric is also used to describe the gate insulator layer.

The term "gate" is context sensitive and can be used in two ways when describing integrated circuits. Gate refers to a circuit for realizing an arbitrary logical function when used in the context of a logic gate. However, as used herein, gate refers to the insulated gate terminal of a three terminal FET when used in the context of transistor circuit configurations or formation of transistor structures. The expression "gate terminal" is generally interchangeable with the expression "gate electrode". A FET can be viewed as a four terminal device when the semiconductor body is considered, for the purpose of describing illustrative embodiments of the present invention, the FET will be described using the traditional gate-drain-source, three terminal model.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Source/drain terminals refer to the terminals of a FET, between which conduction occurs under the influence of an electric field, subsequent to the inversion of the semiconductor surface under the influence of a vertical electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

Overview

A method of forming a dielectric having a thickness less than approximately 7 angstroms (0.7 nm) on a silicon substrate includes chemically passivating a Si surface by forming a hydroxy-silicate ($SiO_{2-x}(OH)_{2x} \cdot nH_2O$ where $0 \leq x \leq 1$, $n \geq$ integer) layer, and nitridizing the passivated Si surface. Nitridation of the passivated Si surface typically converts the hydroxy-silicate layer to a silicon oxynitride ($SiOxN_{(4-2x)/3}$ where $0 \leq x \leq 2$) layer. The resulting silicon oxynitride layer is typically less than or equal to approximately 7 angstroms, and is suitable for use as a MOSFET gate dielectric layer.

The formation of a chemically passivated Si surface prior to nitridation is an important operation in forming an extremely thin dielectric layer. Methods embodying the present invention do not require either a thermal oxidation or a dielectric deposition operation.

In accordance with the present invention, a chemically passivated Si surface is a Si surface that has most of the chemically active sites neutralized, i.e., most of the unsaturated Si bonds tied or filled. By comparison, a non-passivated Si surface is a very active surface with many chemically active sites, i.e., unsaturated Si bonds. A non-passivated Si surface is vulnerable to native oxide growth, and also tends to attract particles. These particles, in turn, tend to increase the defect density of the dielectric layer. A chemically passivated Si surface is resistant to native oxide growth. Furthermore, a chemically passivated Si surface tends to not attract particles. These characteristics of a passivated Si surface are important in forming an extremely thin dielectric layer having a thickness less than or equal to approximately 7 angstroms.

A first illustrative embodiment of the present invention, is described below in connection with FIGS. 1–5. As shown in FIG. 1, a silicon substrate 102 has a sacrificial oxide layer 104 formed thereon. Sacrificial oxide 104 is typically 150 angstroms of chlorinated dry oxide formed using an $O_2/Cl_2$ oxidation operation in a furnace at approximately 900° C.

Figure 2:
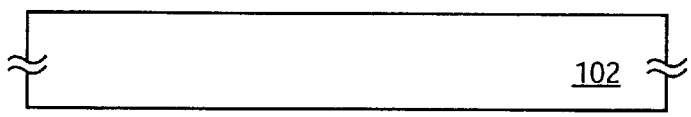
FIG. 2 is a schematic cross-sectional view of the structure of FIG. 1 after the first oxide layer and a portion of the underlying wafer are removed.
Figure 3:
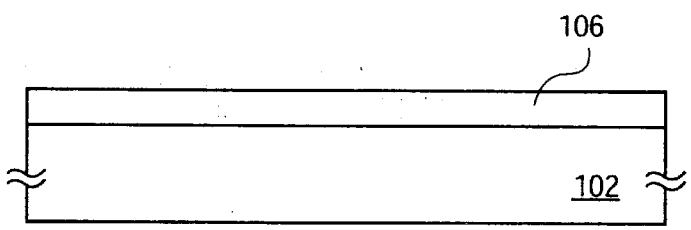
FIG. 3 is a schematic cross-sectional view of the structure of FIG. 2 after a passivating layer has been formed on the surface of the wafer.

Referring to FIGS. 2–3, sacrificial oxide 104 is removed and a passivating hydroxy-silicate layer is formed. More particularly, in this illustrative embodiment, as shown in FIG. 2, sacrificial oxide layer 104 is removed from the surface of substrate 102 by etching. Removal of sacrificial oxide layer 104 may be accomplished by subjecting the wafer to a 50:1 solution of $H_2O:HF$ at approximately 24° C. for approximately 210 seconds. The 50:1 solution of $H_2O:HF$ provides an etch rate of approximately 1 angstrom per minute. By etching for 210 seconds, sacrificial oxide 104 and a portion of the underlying surface of substrate 102 are removed. Etching for an amount of time longer than necessary to remove a particular layer is sometimes referred to as overetching.

In the illustrative embodiment of the present invention, a rinse operation is performed subsequent to the etch with 50:1 $H_2O:HF$. Such a rinse may be accomplished by subjecting the wafer to a bath in deionized water at approximately 24° C. for approximately 200 seconds.

The formation of a passivating hydroxy-silicate layer 106 continues by subjecting the wafer to a 5:1:1 solution of $H_2O:H_2O_2:NH_4OH$ at approximately 24° C. for approximately 10 minutes. The wafer is then subjected to another rinse in deionized water at approximately 24° C. for approximately 315 seconds. The formation of hydroxy-silicate layer 106 continues by subjecting the wafer to a bath in a 5:1:1 solution of $H_2O:H_2O_2:HCl$ at approximately 24° C. for approximately 10 minutes. The wafer is then subjected a rinse operation in deionized water at approximately 24° C. for approximately 315 seconds. A wafer drying operation is then performed. In the illustrative embodiment an isopropyl alcohol vapor jet at approximately 80° C. is used for approximately 10 minutes.

The process operations described above, from removal of sacrificial oxide 104 to the drying of the wafer are preferably performed with no, or very little, wait time between the operations. In the illustrative embodiment, the transfer of wafers from one operation to another is performed by integrated high precision robots.

Those skilled in the art and having the benefit of this disclosure will recognize that other methods to chemically passivate a Si surface after sacrificial oxide 104 is removed may be used. Examples of such methods include subjecting the wafer to: (a) boiling phosphoric acid (approximately 80% at approximately 180° C.); (b) sulfuric acid and hydrogen peroxide (approximately 98% sulfuric acid and 2% hydrogen peroxide at approximately 120° C.); (c) sulfuric acid; hydrogen peroxide, and water (various mixes at temperatures less than 120° C.); (d) ammonium hydroxide, hydrogen peroxide, and water (various mixes at approximately room temperature); (e) nitric acid (various mixes at approximately room temperature); or (f) ozonated water.

Similarly, those skilled in the art and having the benefit of this disclosure will recognize that any suitable method to dry the wafer may be used. For example, a vacuum drying process may be used, wherein the wafer is subjected to a low pressure environment. In this instance, low pressure means a pressure less than standard atmospheric pressure. Typically for a vacuum drying operation, a low pressure that is substantially less than atmospheric pressure would be used. Heating of the wafer may optionally be used to facilitate the drying.

Figure 4:
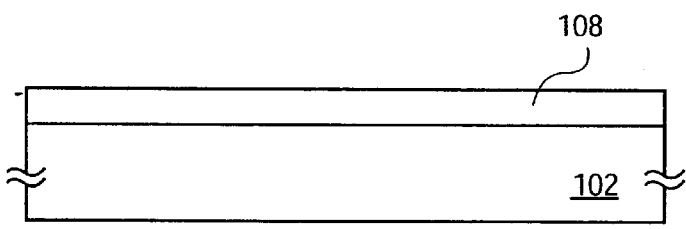
FIG. 4 is a schematic cross-sectional view of the structure of FIG. 3, after the passivating layer has been subjected to a nitridation operation.

Referring now to FIG. 4, subsequent to the formation of hydroxy-silicate layer 106, a nitridation operation is performed to convert hydroxy-silicate layer 106 to a silicon oxynitride layer 108. In the illustrative embodiment, such a nitridation operation is a rapid thermal nitridation performed by subjecting the wafer to $NH_3$ at a temperature in the range of approximately 850° C. to 1000° C. A temperature of 900° C. is preferred. It is also preferable that the nitridation of hydroxy-silicate layer 106 be performed in less than about 12 hours from the time of forming the chemically passivating hydroxy-silicate layer. By keeping the time between these steps short, the integrity of the chemically passivated surface can be preserved.

Those skilled in the art and having the benefit of this disclosure will recognize that other methods of converting hydroxy-silicate layer 106 to silicon oxynitride layer 108. For example, nitridation by subjecting the wafer to an $N_2$ plasma may be used. This plasma process nitridation is not a deposition, but rather an anneal process that changes the composition of hydroxy-silicate layer 106 to an oxynitride layer 108. This plasma nitridation process does not cause any significant change in the thickness of hydroxy-silicate layer 106. A plasma process in accordance with the present invention includes placing the wafer into an $N_2$ plasma ambient. More particularly, the plasma nitridation includes placing the wafer into a parallel plate plasma chamber with a spacing of between approximately 200 and 1000 mils (where 1 mil=0.001 inch, or approximately 25.4 microns); a gas flow of between approximately 0.5 and 3 liters/minute of $N_2$; an RF power between approximately 300 to 600 W; a pressure between approximately 1 to 5 Torrs; at a temperature of approximately 200 to 500° C., for approximately 10 to 90 seconds. The temperature is the temperature in the chamber and is achieved by heating with lamps. At thermal equilibrium, the wafer temperature is equal to the ambient temperature, which in turn, is equal to the chamber temperature.

In one embodiment, the spacing is approximately 400 mils; the gas flow is approximately 2 liters/minute of $N_2$; the RF power is approximately 400 W; the pressure is approximately 1.5 Torrs; the temperature is approximately 400° C., and the duration is approximately 40 seconds.

Figure 5:
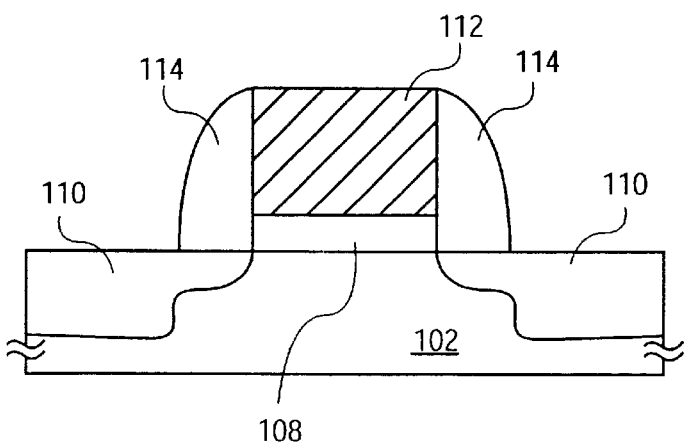
FIG. 5 is a schematic cross-sectional view of the structure of FIG. 4, after further processing operations have formed a FET having as a gate dielectric layer, the passivating layer that was subjected to a nitridation operation.

FIG. 5 shows a cross-sectional view of a MOSFET that includes patterned silicon oxynitride layer 108 as a gate insulating layer. The MOSFET also includes a gate electrode 112 disposed over silicon oxynitride 108, sidewall spacers 114 adjacent gate electrode 112, and source/drain terminals 110 disposed, substantially adjacent gate electrode 112, as shown in FIG. 5. Methods for the formation of gate electrodes, sidewall spacers, and source/drain terminals are well-known in this field. Various known materials and dimensions may be selected for the gate electrodes, sidewall spacers and source/drain terminals. Typical materials may include, but the present invention is not limited to, polysilicon for the gate electrode, silicon nitride for the sidewall spacers, and p-type dopants such as boron to form the source/drain terminals of p-channel MOSFETs and n-type dopants such as arsenic or phosphorous to form the source/drain terminals of n-channel MOSFETs. Similarly, well-known deposition, and patterning methods may be used to form the MOSFET structure of FIG. 5.

Figure 6:
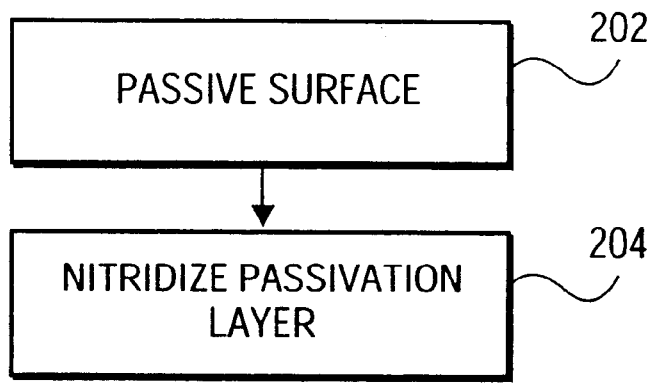
FIG. 6 is a flow diagram of a process in accordance with the present invention.

Referring now to FIG. 6, a flow diagram of a process in accordance with the present invention is shown. A process of making a dielectric layer in accordance with the present invention includes passivating 202 the surface of a substrate. In an illustrative embodiment, the surface of a silicon wafer is passivated by forming a hydroxy-silicate layer on the surface at approximately 24° C. The hydroxy-silicate layer is then nitridized 204. In the illustrative embodiment nitridizing converts the hydroxy-silicate layer to a silicon oxynitride layer. Nitridizing may be accomplished by rapid thermal processing of the wafer in the presence of $NH_3$, or by exposure to an $N_2$ plasma.

Figure 7:
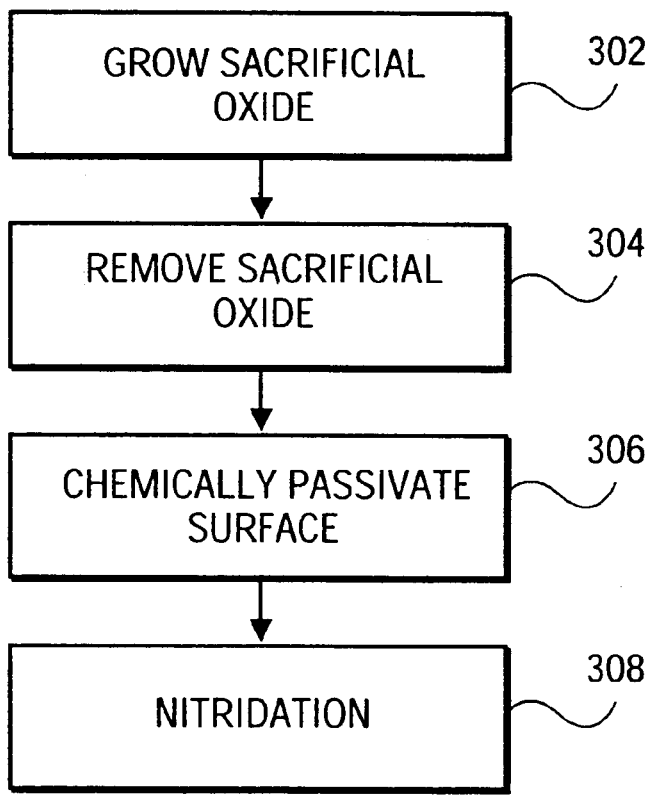
FIG. 7 is a flow diagram of a process in accordance with the present invention.

Referring now FIG. 7, a flow diagram of a process in accordance with the present invention is shown. A very clean substrate surface is helpful in forming an extremely thin dielectric layer. One method of surface cleaning includes the growth and removal of a sacrificial layer from a substrate. A process of making a dielectric layer in accordance with the present invention includes growing 302 a sacrificial oxide on the surface of a silicon wafer. For example, growing approximately 150 angstroms of chlorinated dry oxide using $O_2/Cl_2$ at approximately 900° C. The sacrificial oxide is then removed 304 by a wet etch in a 50:1 solution of $H_2O$:HF at approximately 24° C. for approximately 210 seconds. Typically, the wafer is rinsed after a wet etch operation. Such a rinse may be accomplished by subjecting the wafer to a bath in deionized water at approximately 24° C. for approximately 200 seconds. The surface of the wafer is then chemically passivated 306. In the illustrative embodiment the formation of a passivating hydroxy-silicate layer continues after the rinse operation by subjecting the wafer to a 5:1:1 solution of $H_2O$:$H_2O_2$:$NH_4OH$ at approximately 24° C. for approximately 10 minutes. The wafer is then subjected to another rinse in deionized water at approximately 24° C. for approximately 315 seconds. The formation of the hydroxy-silicate layer continues by subjecting the wafer to a bath in a 5:1:1 solution of $H_2O$:$H_2O_2$:HCl at approximately 24° C. for approximately 10 minutes. The wafer is then subjected a rinse operation in deionized water at approximately 24° C. for approximately 315 seconds. A wafer drying operation is then performed. In the illustrative embodiment an isopropyl alcohol vapor jet at approximately 80° C. is used for approximately 10 minutes. After formation of the hydroxy-silicate passivating layer, a nitridation 308 operation is performed. In the illustrative embodiment, a rapid thermal nitridation using $NH_3$ for approximately 30 seconds at approximately 900° C. is performed.

Various other layers of insulators and conducting material are formed above the gate level, as is well understood in the field of semiconductor manufacturing and integrated circuit design.

Conclusion

Embodiments of the present invention provide extremely thin dielectric layers. Dielectric layers less than or equal to 7 angstroms, which are suitable for use as the gate insulating layer for FETs, are created by forming a chemically passivated Si surface, and following this with a nitridation anneal. Neither traditional thermal oxidation, nor dielectric deposition are required to form a gate insulating layer in accordance with the present invention.

An advantage of embodiments of the present invention is that a thermal oxidation is avoided thereby improving the thermal budget for the other process operations required to produce an integrated circuit.

A further advantage of embodiments of the present invention is that a portion of the gate dielectric formation processing may be performed at approximately 24° C.

A further advantage of embodiments of the present invention is that silicon oxynitride has a higher dielectric constant than silicon dioxide. By using this material property, a FET having a silicon oxynitride gate insulator layer of a certain physical thickness is electrically equivalent to a FET with a silicon dioxide layer that is even thinner than the silicon oxynitride layer.

It will be recognized by those skilled in the art and having the benefit of this disclosure that the present invention is applicable to the formation of both n-channel FETs (NFETs) and p-channel FETs (PFETs).

The present invention may be implemented with various changes and substitutions to the illustrated embodiments. For example, the present invention may be practiced with not only with silicon wafers as substrates, but also with other substrates, including but not limited to such substrates as silicon on insulator (SOI).

Although specific embodiments, including specific equipment, parameters, methods and materials have been described, it will be readily understood by those skilled in the art and having the benefit of this disclosure, that various other changes in the details, materials, and arrangements of the materials and steps which have been described and illustrated in order to explain the nature of this invention may be made without departing from the principles and scope of the invention as expressed in the subjoined claims.

What is claimed is:

1. A method of forming a dielectric layer on a surface of a substrate, the method comprising:
   passivating the surface of the substrate;
   rinsing the passivated surface; and
   nitridizing the passivated surface to form a silicon oxynitride layer having a thickness no greater than 7 angstroms.

2. The method of claim 1, wherein said passivating the surface of the substrate comprises forming a hydroxy-silicate layer.

3. The method of claim 2, wherein the hydroxy-silicate layer is a material in accordance with the expression $(SiO_{2-x}(OH)_{2x} \cdot nH_2O$ where $0 \leq x \leq 1$, $n \geq 0$).

4. The method of claim 1, wherein said passivating the surface of the substrate comprises treating the surface with a base and treating the surface with an acid.

5. A method of forming a dielectric layer on a surface of a substrate, the method comprising:
   passivating the surface of the substrate, wherein passivating the surface of the substrate includes:
      subjecting the surface of the substrate to a bath in deionized water at approximately 24° C. for approximately 200 seconds;
      subjecting the surface of the substrate to a 5:1:1 solution of $H_2O$:$H_2O_2$:$NH_4OH$ at approximately 24° C. for approximately 10 minutes;

rinsing the surface of the substrate; and
subjecting the surface of the substrate to a bath in a 5:1:1 solution of $H_2O:H_2O_2:HCl$ at approximately 24° C. for approximately 10 minutes;
rinsing the passivated surface; and
nitridizing the passivated surface.

6. A method of forming a dielectric layer on a surface of a substrate, the method comprising:
passivating the surface of the substrate;
rinsing the surface by first treating the surface with a base and then treating the surface with an acid;
drying the passivated surface in response to rinsing the passivated surface, wherein drying the passivated surface includes subjecting the passivated surface to an isopropyl alcohol vapor jet at approximately 80° C. for approximately 10 minutes; and
nitridizing the passivated surface.

7. A method of forming a dielectric layer on a surface of a substrate, the method comprising:
passivating the surface of the substrate;
rinsing the passivated surface;
drying the passivated surface in response to rinsing the passivated surface, wherein drying the passivated surface includes exposing the passivated surface to a pressure that is less than atmospheric pressure and subjecting the passivated surface to an isopropyl alcohol vapor jet at approximately 80° C. for approximately 10 minutes; and
nitridizing the passivated surface.

8. The method of claim 1, wherein said passivating the surface of the substrate comprises treating the surface with phosphoric acid.

9. The method of claim 1, wherein said passivating the surface of the substrate comprises treating the surface with sulfuric acid and hydrogen peroxide.

10. The method of claim 1, wherein passivating the surface of the substrate comprises treating the surface with ammonium hydroxide, hydrogen peroxide, and water.

11. The method of claim 1, wherein said passivating the surface of the substrate comprises treating the surface with nitric acid.

12. The method of claim 1, wherein passivating the surface of the substrate comprises treating the surface with ozonated water.

13. A method of making a field effect transistor, comprising:
forming an oxide layer on a substrate;
removing the oxide layer;
forming a hydroxy-silicate layer on a surface of the substrate at a temperature approximately equal to 24° C.;
rinsing the hydroxy-silicate layer with deionized water;
converting the hydroxy-silicate layer to a silicon oxynitride layer having a thickness no greater than 7 angstroms;
forming a gate electrode layer over the oxynitride layer;
patterning the gate electrode layer to form a gate electrode; and
forming source/drain terminals substantially adjacent the gate electrode.

14. The method of claim 13, wherein said converting the hydroxy-silicate layer to the silicon oxynitride layer comprises plasma nitridation.

15. The method of claim 14, wherein said plasma nitridation comprises placing the substrate in a parallel plate plasma chamber with a plate spacing in the range of 200 to 1000 mils, an RF power in the range of 300 to 600W, a gas flow in the range of 0.5 to 3 liters/minute of $N_2$, a pressure in the range of 1 to 5 Torrs, at a temperature in the range of 200 to 500° C., for the range of 10 to 90 seconds.

16. The method of claim 13, wherein said converting the hydroxy-silicate layer to the silicon oxynitride layer comprises rapid thermal nitridation using $NH_3$ for approximately 30 seconds at approximately 900° C.

17. The method of claim 5, wherein said rinsing the passivated surface comprises rinsing the passivated surface with deionized water at approximately 24° C. for approximately 315 seconds.

* * * * *

UNITED STATES PATENT AND TRADEMARK OFFICE
CERTIFICATE OF CORRECTION

PATENT NO. : 6,667,232 B2
DATED : December 23, 2003
INVENTOR(S) : Keating et al.

It is certified that error appears in the above-identified patent and that said Letters Patent is hereby corrected as shown below:

<u>Title page,</u>
Item [54], Title delete "THIN DIELECTRIC LAYERS AND NON-THERMAL FORMATION THEREOF", insert -- METHOD OF FORMING A THIN GATE DIELECTRIC LAYER --.

Signed and Sealed this

Twentieth Day of April, 2004

JON W. DUDAS
*Acting Director of the United States Patent and Trademark Office*